United States Patent
Lu (10) Patent No.: US 9,842,935 B2
(45) Date of Patent: Dec. 12, 2017

(54) LOW TEMPERATURE POLY SILICON (LTPS) THIN FILM TRANSISTOR (TFT) AND THE MANUFACTURING METHOD THEREOF

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Changming Lu, Guangdong (CN)

(73) Assignees: Shenzhen China Star Optoelectronics Technology Co., Ltd, Shenzhen, Guangdong (CN); WUHAN CHINA STAR OPTOELECTRONICS TECHNOLOGY CO., LTD, Wuhan, Hubei (CN)

( * ) Notice: Subject to any disclaimer, the term of this patent is extended or adjusted under 35 U.S.C. 154(b) by 78 days.

(21) Appl. No.: 14/909,092

(22) PCT Filed: Aug. 28, 2015

(86) PCT No.: PCT/CN2015/088415
§ 371 (c)(1),
(2) Date: Jan. 29, 2016

(87) PCT Pub. No.: WO2017/016023
PCT Pub. Date: Feb. 2, 2017

(65) Prior Publication Data
US 2017/0162706 A1 Jun. 8, 2017

(30) Foreign Application Priority Data

Jul. 29, 2015 (CN) .......................... 2015 1 0456334

(51) Int. Cl.
*H01L 29/786* (2006.01)
*H01L 29/66* (2006.01)
(Continued)

(52) U.S. Cl.
CPC .... *H01L 29/78621* (2013.01); *H01L 21/0273* (2013.01); *H01L 21/02532* (2013.01);
(Continued)

(58) Field of Classification Search
None
See application file for complete search history.

(56) References Cited

U.S. PATENT DOCUMENTS 6,846,707 B2 * 1/2005 Chang ................. H01L 27/1214
257/E21.413

* cited by examiner

*Primary Examiner* — Michelle Mandala
(74) *Attorney, Agent, or Firm* — Andrew C. Cheng (57) ABSTRACT

The present disclosure discloses a LTPS TFT and the manufacturing method thereof. The method includes: forming a semiconductor layer and a LTPS layer on the same surface on a base layer; forming an oxide layer is formed on one side of the semiconductor layer facing away the base layer, and forming the oxide layer on one side of the LTPS layer facing away the base layer; forming a first photoresist layer of a first predetermined thickness on the oxide layer; arranging a corresponding first cobalt layer on each of the photoresist layers, a vertical projection of the first cobalt layer overlaps with the vertical projection of the corresponding first photoresist layer; doping high-concentration doping ions into a first specific area of the semiconductor layer. With such configuration, the number of the masking process is decreased and the manufacturing time is reduced.

15 Claims, 6 Drawing Sheets

(51) Int. Cl.
  *H01L 27/12*      (2006.01)
  *H01L 21/02*      (2006.01)
  *H01L 21/027*     (2006.01)
  *H01L 21/3105*    (2006.01)
  *H01L 21/3205*    (2006.01)
  *H01L 21/266*     (2006.01)
  *H01L 21/265*     (2006.01)
  *H01L 21/311*     (2006.01)

(52) U.S. Cl.
  CPC ...... *H01L 21/02595* (2013.01); *H01L 21/266* (2013.01); *H01L 21/26513* (2013.01); *H01L 21/31058* (2013.01); *H01L 21/31138* (2013.01); *H01L 21/32051* (2013.01); *H01L 27/127* (2013.01); *H01L 27/1218* (2013.01); *H01L 27/1222* (2013.01); *H01L 29/66757* (2013.01); *H01L 29/78603* (2013.01); *H01L 29/78675* (2013.01)

| Improve LDD Process | | L1 | L2 | L3 | L4 | L5 | L6 | L7 | L8 | L9 |
|---|---|---|---|---|---|---|---|---|---|---|
| PR thickness | Thickness (um) | 1.5 | 1.5 | 1.5 | 2 | 2 | 2 | 2.4 | 2.4 | 2.4 |
| Ashing | Power (W) | 1000 | 1300 | 1600 | 1000 | 1300 | 1600 | 1000 | 1300 | 1600 |
| | time (sec) | 250 | 300 | 350 | 300 | 350 | 250 | 350 | 250 | 300 |
| P- doping Dosage | | 2.5E+13 | 2.0E+13 | 2.5E+13 | 2.5E+13 | 1.5E+13 | 2.5E+13 | 2.0E+13 | 2.5E+13 | 1.5E+13 |
| CD data | Pre-AVE | 10.99 | 11.01 | 10.95 | 11.54 | 11.61 | 11.63 | 11.32 | 11.40 | 11.25 |
| | Pre-Sigma | 0.21 | 0.21 | 0.32 | 0.23 | 0.19 | 0.19 | 0.17 | 0.12 | 0.12 |
| | After-AVE | 5.12 | 3.27 | | 7.90 | 4.34 | 5.47 | 7.68 | 7.95 | 5.85 |
| | After-Sigma | 0.37 | 0.38 | | 0.39 | 0.29 | 0.26 | 0.32 | 0.19 | 0.43 |
| | Difference-Average | -5.87 | -7.74 | -10.95 | -3.64 | -7.27 | -6.17 | -3.64 | -3.45 | -5.58 |
| | Difference-Min | -5.16 | -6.92 | -10.39 | -2.96 | -6.96 | -5.83 | -3.29 | -2.89 | -4.47 |
| | Difference-Max | -6.76 | -8.45 | -12.00 | -4.70 | -7.74 | -6.81 | -4.24 | -3.88 | -6.32 |
| Array Yield | | 89.3% | 60.8% | 0.0% | 83.8% | 83.8% | 83.8% | 87.5% | 87.5% | 94.8% |

FIG. 14

LOW TEMPERATURE POLY SILICON (LTPS) THIN FILM TRANSISTOR (TFT) AND THE MANUFACTURING METHOD THEREOF

CROSS REFERENCE

This application claims the priority of Chinese Patent Application No. 201510456334.4, entitled "LOW TEMPERATURE POLY SILICON (LTPS) THIN FILM TRANSISTOR (TFT) AND THE MANUFACTURING METHOD THEREOF", filed on Jul. 29, 2015, the disclosure of which is incorporated herein by reference in its entirety.

FIELD OF THE INVENTION

The present invention relates to a transistor technology field, and more particularly to a LTPS TFT and the manufacturing method thereof.

BACKGROUND OF THE INVENTION

The LTPS adopts polycrystalline silicon to manufacture TFT. As compared with the production of amorphous silicon TFT, LTPS TFT has higher electron mobility. LTPS TFT can be applied to the production of liquid crystal display having a higher resolution and low power consumption. Thus, low-temperature polysilicon technology has been widely adopted and developed.

Lightly Doped Drain (LDD) relates to arrange a lightly doped area within a trench of the TFT, and the lightly doped area is close to the drain. This may decrease the peak electrical field in a rim of the drain so as to suppress heat electron effect. Currently, when the LTPS technology is adopted in LDD manufacturing process, the mask process has to be performed twice, respectively during heavy and light doped processes in source and drain. Not only the cost is high, but also the manufacturing period is long.

SUMMARY OF THE INVENTION

The technical issue that the embodiment of the present disclosure solves is to provide a LTPS TFT and the manufacturing method thereof, resolving the issue of twice mask during the heavy and light doped process in source and drain.

In one aspect, a manufacturing method of low temperature poly silicon (LTPS) thin film transistors (TFTs) includes: forming a semiconductor layer and a LTPS layer on the same surface on a base layer; forming an oxide layer is formed on one side of the semiconductor layer facing away the base layer, and forming the oxide layer on one side of the LTPS layer facing away the base layer; forming a first photoresist layer of a first predetermined thickness on the oxide layer; arranging a corresponding first cobalt layer on each of the photoresist layers, a vertical projection of the first cobalt layer overlaps with the vertical projection of the corresponding first photoresist layer; doping high-concentration doping ions into a first specific area of the semiconductor layer; removing the first cobalt layer, and applying an ashing process to a portion of the first photoresist layers to obtain second photoresist layers of a second predetermined thickness, the second predetermined thickness is smaller than the first predetermined thickness; arranging a corresponding second cobalt layer on the second photoresist layer, a vertical projection of the second cobalt layer is overlapped with the vertical projection of the corresponding second photoresist layer; doping low-concentration doping ions. Into a second specific area of the semiconductor layer; and removing the second cobalt layer, and applying the ashing process to the second photoresist layers to remove the second photoresist layers.

Wherein the step of applying an ashing process to a portion of the first photoresist layers to obtain second photoresist layers of a second predetermined thickness includes: adopting an ion etching machine to etch a portion of the first photoresist layers to obtain the second photoresist layers of the second predetermined thickness, wherein an etching power of the ion etching machine is in a range between 1000 and 1600 W, and an etching time period is in a range between 250 and 350 s.

Wherein the base layer includes a substrate, a silicon nitride layer and a silicon oxide layer, wherein: the silicon nitride layer is arranged on the substrate, and the silicon oxide layer is arranged on one side of the silicon nitride layer facing away the substrate.

Wherein the step of applying the ashing process to the second photoresist layers to remove the second photoresist layers further includes: forming a gate on one side of the oxide layer facing away the semiconductor layer.

Wherein the first predetermined thickness is in a range between 1 and 3 micrometers.

Wherein the step of doping high-concentration doping ions into a first specific area of the semiconductor layer further includes: adopting an ion implantation method to dope the high-concentration doping ions to the first specific area of the semiconductor layer; and wherein the high-concentration doping ions includes high-concentration P-type doping ions or high-concentration N-type doping ions.

Wherein the step of doping a low-concentration doping ions into a second specific area of the semiconductor layer further includes: adopting an ion implantation method to dope the low-concentration doping ions to the second specific area of the semiconductor layer; and wherein the low-concentration doping ions includes low-concentration P-type doping ions or low-concentration N-type doping ions.

In another aspect, a LTPS TFT includes: a base layer having a semiconductor layer and a LTPS layer formed on the same surface on the base layer; an oxide layer is formed on one side of the semiconductor layer facing away the base layer, and the oxide layer is formed on one side of the LTPS layer facing away the base layer; doping high-concentration doping ions into a first specific area of the semiconductor layer; and doping low-concentration doping ions into a second specific area of the semiconductor layer.

In one embodiment, the method includes: forming a semiconductor layer and a LTPS layer on the same surface on a base layer; forming an oxide layer is formed on one side of the semiconductor layer facing away the base layer, and forming the oxide layer on one side of the LTPS layer facing away the base layer; forming a first photoresist layer of a first predetermined thickness on the oxide layer; arranging a corresponding first cobalt layer on each of the photoresist layers, a vertical projection of the first cobalt layer overlaps with the vertical projection of the corresponding first photoresist layer; doping high-concentration doping ions into a first specific area of the semiconductor layer; removing the first cobalt layer, and applying an ashing process to a portion of the first photoresist layers to obtain second photoresist layers of a second predetermined thickness, the second predetermined thickness is smaller than the first predetermined thickness; arranging a corresponding second cobalt layer on the second photoresist layer, a vertical projection of the second cobalt layer is overlapped with the vertical projection of the corresponding second photoresist layer; doping low-concentration doping ions. Into a second specific area of the semiconductor layer; and removing the second cobalt layer, and applying the ashing process to the second photoresist layers to remove the second photoresist layers. With such configuration, the number of the masking process is decreased and the manufacturing time is reduced.

BRIEF DESCRIPTION OF THE DRAWINGS

In order to more clearly illustrate the embodiments of the present disclosure or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

Figure 1:
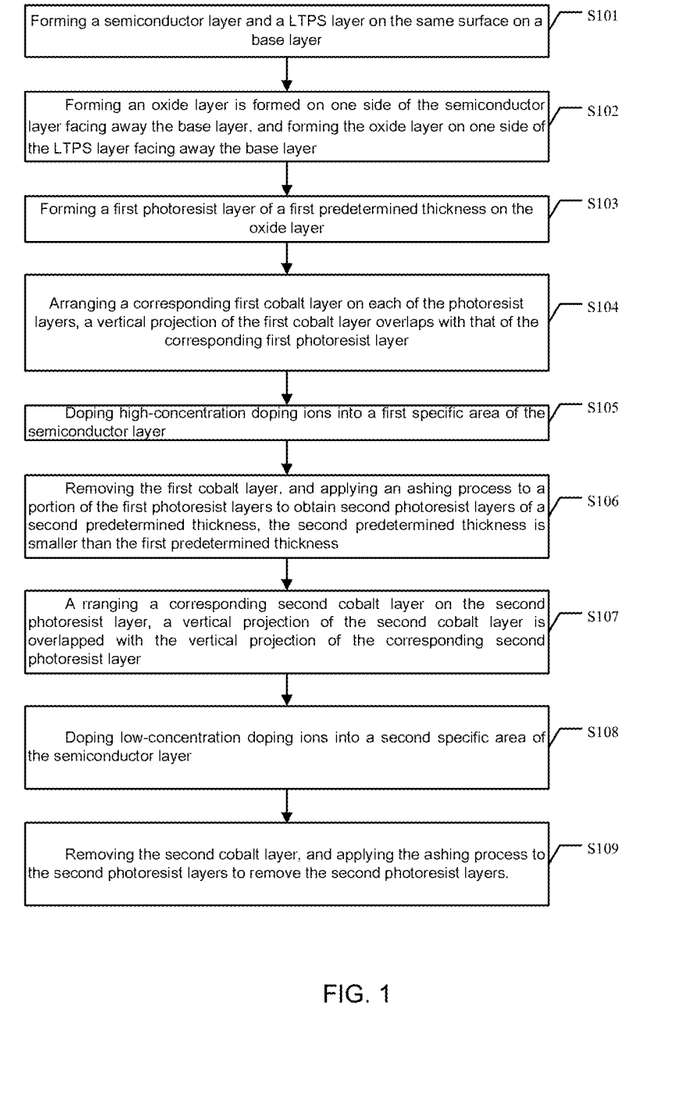
FIG. 1 is a flowchart illustrating the manufacturing method of LTPS TFT in accordance with one embodiment.

FIG. 1 is a flowchart illustrating the manufacturing method of LTPS TFT in accordance with one embodiment. The manufacturing method includes the following steps.

In step S101, a semiconductor layer and a LTPS layer are formed on the same surface on a base layer.

Figures 2, 3:
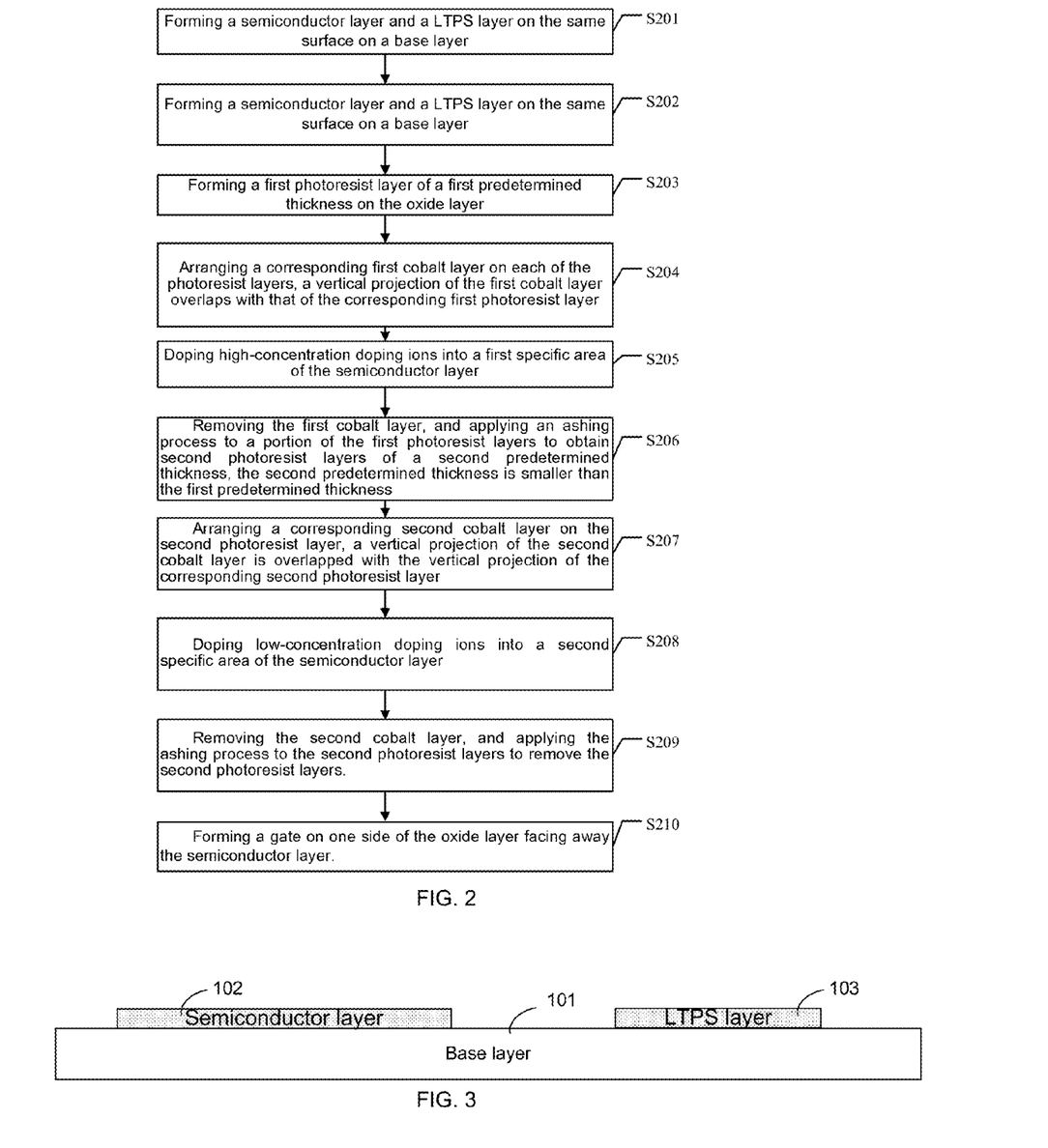
FIG. 2 is a flowchart illustrating the manufacturing method of LTPS TFT in accordance with another embodiment.
FIG. 3 is a cross-sectional view of the LTPS TFT corresponding to step S101 of the manufacturing method of LTPS TFT in accordance with one embodiment.

In the embodiment, as shown in FIG. 3, the semiconductor layer 102 and the LTPS layer 103 are arranged on the same side of the base layer 101. The semiconductor layer 102 is configured for doped with doping ions to form a source/drain doped area. The LTPS layer 103 may be formed by radiating the amorphous silicon by excimer laser. The base layer 101 may be a glass substrate and silicide, which provides an insulation effect.

Preferably, in step S101, the base layer includes a substrate, a silicon nitride layer and a silicon oxide layer.

Figure 12:
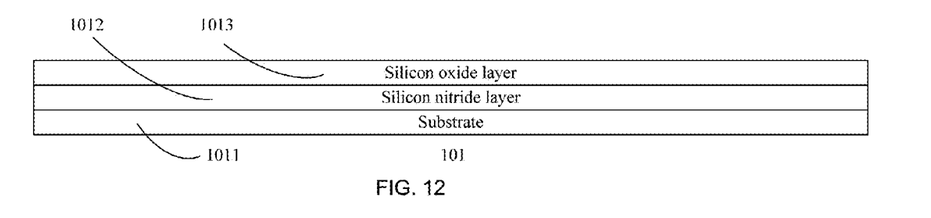
FIG. 12 is a cross-sectional view of the base layer corresponding to the manufacturing method of LTPS TFT in accordance with one embodiment.

The silicon nitride layer is arranged on the substrate, and the silicon oxide layer is arranged on one side of the silicon nitride layer facing away the substrate.

FIG. 12 is a cross-sectional view of the base layer corresponding to the manufacturing method of LTPS TFT in accordance with one embodiment. The base layer 101 includes substrate 1011, the silicon nitride layer 1012, and the silicon oxide layer 1013. The substrate 1011 may be the glass substrate, the silicon nitride layer 1012 may be SiNx, and the silicon oxide layer 1013 may be SiOx.

In step S102, an oxide layer is formed on one side of the semiconductor layer facing away the base layer, and the oxide layer is formed on one side of the LTPS layer facing away the base layer.

Figure 4:
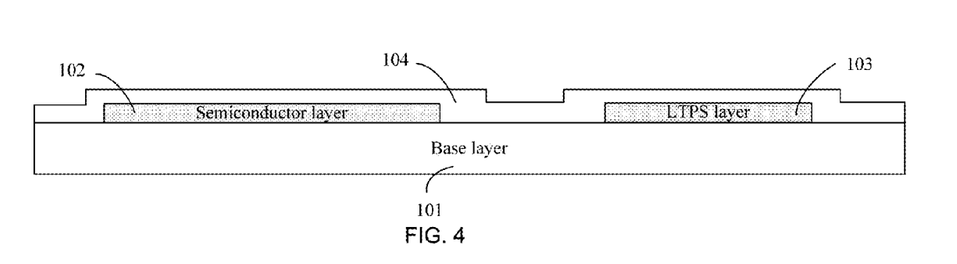
FIG. 4 is a cross-sectional view of the LTPS TFT corresponding to step S102 of the manufacturing method of LTPS TFT in accordance with one embodiment.

As shown in FIG. 4, the oxide layer 104 is arranged on the semiconductor layer 102 and the LTPS layer 103 for insulating the gate and the source/drain. The thickness of the oxide layer may be in a range between several nanometers to dozens of nanometers.

In step S103, a first photoresist layer of a first predetermined thickness is formed on the oxide layer.

Figure 5:
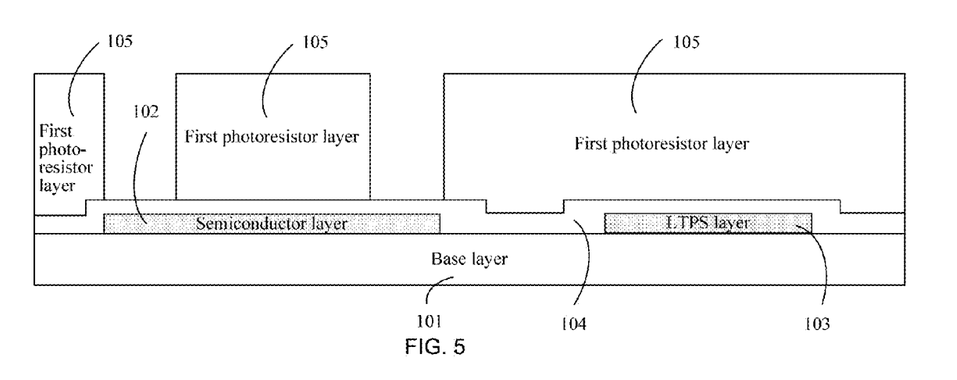
FIG. 5 is a cross-sectional view of the LTPS TFT corresponding to step S103 of the manufacturing method of LTPS TFT in accordance with one embodiment.

As shown in FIG. 5, the first photoresist layer 105 is arranged on the oxide layer 104. The first photoresist layer 105 may be formed by the steps including photoresist coating, pre-baking, alignment, exposure, post-baking, developing, and hard-baking. A first photoresist layer may be formed on the oxide layer via precisely controlling the lithography machine. The thickness of the first photoresist layer 105 may be predetermined. A plurality of first photoresist layers 105 may be configured such that the areas covered by the first photoresist layer 105 are protected. The above steps may only be applied toward the area not covered by the first photoresist layer 105. After the first photoresist layer 105 is formed, the ADI process is performed.

Alternatively, in step S103, the first predetermined thickness may be in a range between 1 and 3 micrometers.

In the embodiment, the thickness of the first photoresist layer, i.e., between 1 and 3 micrometers, may be configured by the lithographic machine.

In step S104, a corresponding first cobalt layer is arranged on each of the photoresist layers. A vertical projection of the first cobalt layer overlaps with that of the corresponding first photoresist layer.

Figure 6:
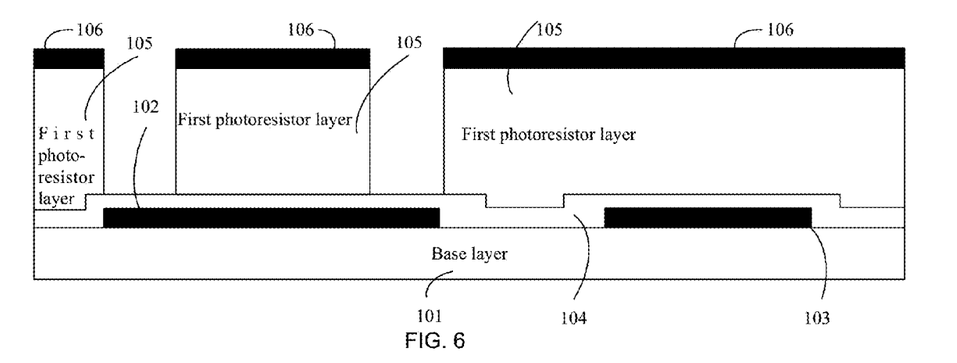
FIG. 6 is a cross-sectional view of the LTPS TFT corresponding to step S104 of the manufacturing method of LTPS TFT in accordance with one embodiment.

As shown in FIG. 6, the first cobalt layer 106 is arranged on the corresponding first photoresist layer 105. The first cobalt layer 106 is configured for preventing the doping ions from passing through the photoresist in the following step so as to prevent the doped area from being doped. By configuring the vertical projection of the first cobalt layer 106 to be overlapped with that of the first photoresist layer 105, the doping ions may be only doped within a specific area of the semiconductor layer 102.

In step S105, the first specific area of the semiconductor layer is doped with doping ions having a high-concentration.

Figure 7:
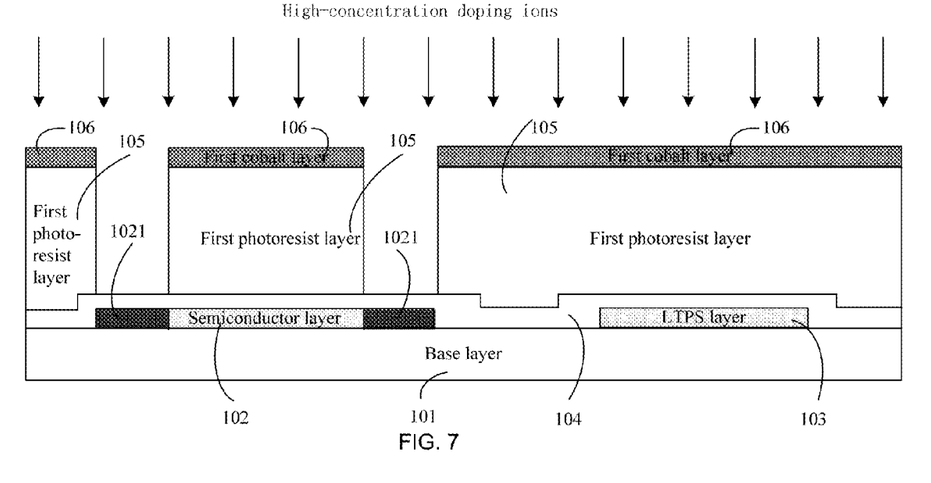
FIG. 7 is a cross-sectional view of the LTPS TFT corresponding to step S105 of the manufacturing method of LTPS TFT in accordance with one embodiment.

As shown in FIG. 7, the first specific area 1021 of the semiconductor layer 102 is doped with doping ions having high-concentration, which may be accomplished by ion implantation. The first specific area 1021 is the source/drain area, which relates to the source/drain (S/D) doping. The first specific area 1021 is the un-covered area of the first photoresist layer 105. The dimension of the first specific area 1021 may be controlled by the location and the dimension of the first photoresist layer 105. The high-concentration may be larger than $1\times10^{17}/cm^3$.

Alternatively, in step S105, the first specific area of the semiconductor layer doped with the doping ions having high-concentration includes:

Adopting the ion implantation method to doping the high-concentration ions into the first specific area of the semiconductor layer.

In the embodiment, the doping ions may be implanted into the first specific area 1021 of the semiconductor layer 102 by ion implantation machine. Alternatively, the high-concentration doping ions may include low-concentration P-type doping ions or low-concentration N-type doping ions. P-type doping ions may include ions within the five groups, such as nitrogen, phosphorus, and arsenic, and N-type doping ions may include ions within the three groups, such as boron, aluminum, and gallium.

In step S106, the first cobalt layer is removed, and an ashing process is applied to the first photoresist layers to obtain second photoresist layers of a second predetermined thickness. The second predetermined thickness is smaller than the first predetermined thickness.

Figure 8:
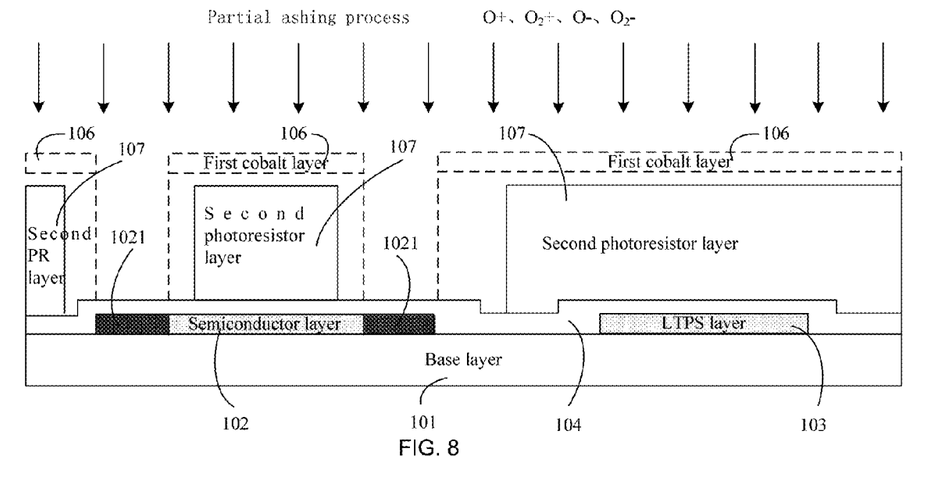
FIG. 8 is a cross-sectional view of the LTPS TFT corresponding to step S106 of the manufacturing method of LTPS TFT in accordance with one embodiment.

As shown in FIG. 8, after the first cobalt layer 106 is removed, the ashing process is applied to the first photoresist layers 105 such that a portion of the first photoresist layer 105 is stripped. As such, second photoresist layers 107 of the predetermined thickness are formed. As the first photoresist layers 105 are stripped to obtain the second photoresist layers 107, the second predetermined thickness of the second photoresist layers 107 is smaller than the first predetermined thickness of the first photoresist layers 105. The first photoresist layer 105 may be partially etched by an etching machine. The etching method may include Plasma Etching (PE), Reactive Ion Etch (RIE), Ion Beam Etch (IBE), and Inductive Coupled Plasma (ICP). After the second photoresist layers 107 are formed, the ADI process is performed. The air adopted within the ashing process may be $O_2$ or $O_3$, $CF_4$, $N_2O$, or NO. The manufacturing parameters adopted within the ashing process may be pre-configured.

Alternatively, in step S106, the ashing process is applied to a portion of the first photoresist layers 105 to obtain the second photoresist layers of second predetermined thickness. The step includes: adopting the ion etching machine to etch a portion of the first photoresist layer to obtain the second photoresist layer of second predetermined thickness, wherein the etching power of the ion etching machine may be in a range between 1000 and 1600 W, and the etching time period is in a range between 250 and 350 s.

In the embodiment, the parameters of the ion etching machine may be configured. For instance, the etching power of the ion etching machine may be in a range between 1000 and 1600 W, and the etching time period is in a range between 250 and 350 s. The parameters of the ion etching machine may be a portion of the parameters of the ashing process.

In step S107, a corresponding second cobalt layer is arranged on the second photoresist layer. The vertical projection of the second cobalt layer is overlapped with that of the corresponding second photoresist layer.

Figure 9:
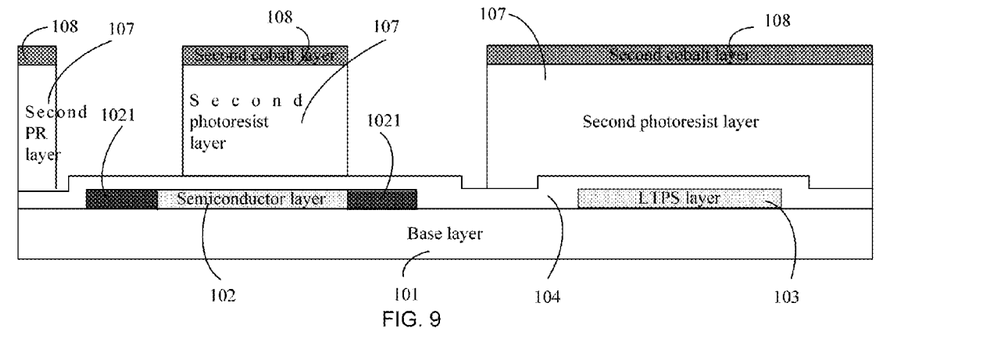
FIG. 9 is a cross-sectional view of the LTPS TFT corresponding to step S107 of the manufacturing method of LTPS TFT in accordance with one embodiment.

As shown in FIG. 9, a second cobalt layer 108 is arranged on the corresponding second photoresist layer 107. The second cobalt layer 108 is configured for preventing the doping ions from passing through the photoresist, so as to prevent the non-doped area from being doped. The vertical projection of the second cobalt layer 108 is overlapped with that of the corresponding second photoresist layer 107. As such, the doping ions may be doped into the specific area of the semiconductor layer 102.

In step S108, the second specific area of the semiconductor layer is doped with low-concentration doping ions.

Figure 10:
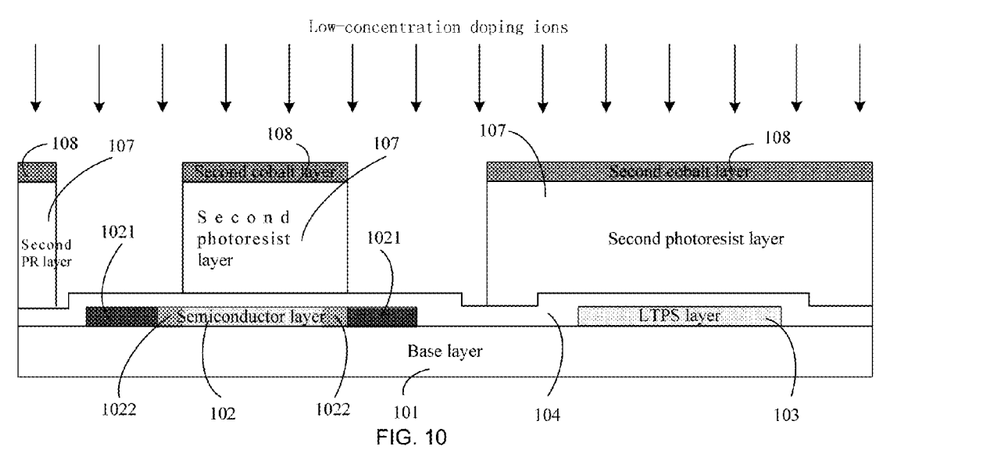
FIG. 10 is a cross-sectional view of the LTPS TFT corresponding to step S108 of the manufacturing method of LTPS TFT in accordance with one embodiment.

In the embodiment, as shown in FIG. 10, the second specific area 1022 within the semiconductor layer 102 is doped with the low-concentration doping ions via ion implantation method. The second specific area 1022 connects with the first specific area 1021. The second specific area 1022 is of LDD doping. The second specific area 1022 is the un-covered area of the second photoresist layer 107. The dimension of the second specific area 1022 may be controlled by configuring the location and the dimension of the second photoresist layer 107. The low-concentration may be smaller than $1\times10^{14}/cm^3$.

Alternatively, in step S108, the second specific area of the semiconductor layer doped with the low-concentration doping ions may include:

Adopting the ion implantation method to doping the low-concentration ions into the second specific area of the semiconductor layer.

In the embodiment, the doping ions may be implanted into the second specific area 1022 of the semiconductor layer 102 by ion implantation machine. Alternatively, the low-concentration doping ions may include low-concentration P-type doping ions or low-concentration N-type doping ions. P-type doping ions may include ions within the five groups, such as nitrogen, phosphorus, and arsenic, and N-type doping ions may include ions within the three groups, such as boron, aluminum, and gallium.

In step S109, the second cobalt layer is removed, and the ashing process is applied to the second photoresist layers to remove the second photoresist layer.

Figure 11:
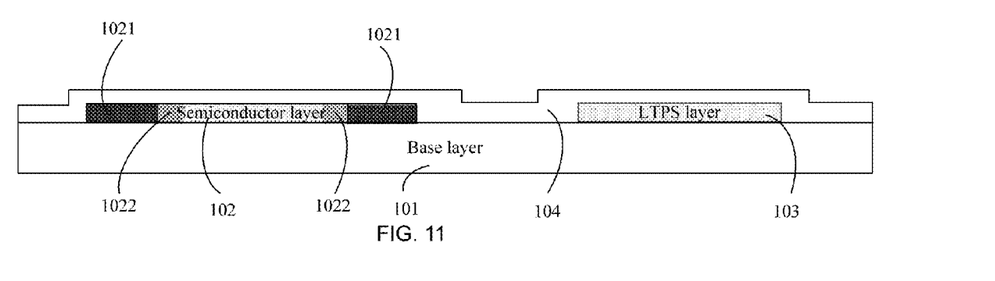
FIG. 11 is a cross-sectional view of the LTPS TFT corresponding to step S109 of the manufacturing method of LTPS TFT in accordance with one embodiment.

As shown in FIG. 11, after the LDD process is complete, the second cobalt layer 108 is removed, and the ashing process is applied to the second photoresist layer 107 so as to strip the second photoresist layer 107 completely. The air adopted within the ashing process may be $O_2$ or $O_3$, $CF_4$, $N_2O$, or NO. The manufacturing parameters adopted within the ashing process may be pre-configured.

In the embodiment, the first photoresist layer 105 is formed. The first specific area 1021 of the semiconductor layer 102 is doped with the high-concentration doping ions to complete the SD doping. After the SD doping is completed, the first photoresist layer 105 is not completely stripped. In step S106, the ashing process is applied to the first photoresist layer 105 such that the first photoresist layer 105 becomes the second photoresist layer 107. Afterward, the low-concentration doping ions are doped within the second specific area 1022 of the semiconductor layer 102 via the second photoresist layer 107 to complete the LDD doping. During the manufacturing process, after the photoresist is coated once, two doping processes, including the SD doping and the LDD doping, are completed. Only one masking process is adopted during the doping process. Compared to the conventional technology, the number of the masking process is decreased and the manufacturing time is reduced.

FIG. 2 is a flowchart illustrating the manufacturing method of LTPS TFT in accordance with another embodiment. The manufacturing method includes the following steps.

In step S201, a semiconductor layer and a LTPS layer are formed on the same surface on a base layer.

In step S202, an oxide layer is formed on one side of the semiconductor layer facing away the base layer, and the oxide layer is formed on one side of the LTPS layer facing away the base layer.

In step S203, a first photoresist layer of a first predetermined thickness is formed on the oxide layer.

In step S204, a first cobalt layer is arranged corresponding to one photoresist layer. A vertical projection of the first cobalt layer overlaps with that of the corresponding first photoresist layer.

In step S205, the first specific area of the semiconductor layer is doped with doping ions having a high-concentration.

In step S206, the first cobalt layer is removed, and an ashing process is applied to the first photoresist layers to obtain second photoresist layers of a second predetermined thickness. The second predetermined thickness is smaller than the first predetermined thickness.

In step S207, a corresponding second cobalt layer is arranged on the second photoresist layer. The vertical projection of the second cobalt layer is overlapped with that of the corresponding second photoresist layer.

In step S208, the second specific area of the semiconductor layer is doped with low-concentration doping ions.

In step S209, the second cobalt layer is removed, and the ashing process is applied to the second photoresist layers to remove the second photoresist layer.

In step S210, a gate is formed on one side of the oxide layer facing away the semiconductor layer.

Figure 13:
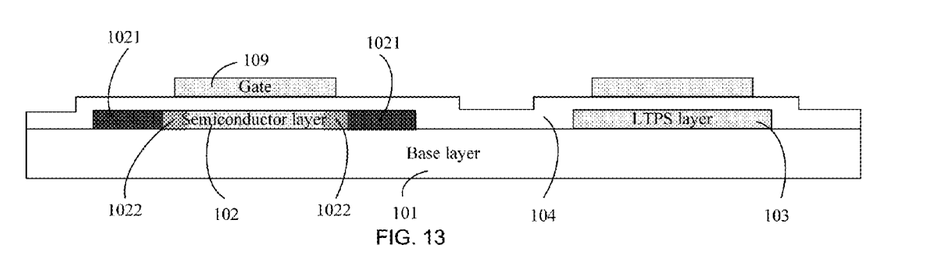
FIG. 13 is a cross-sectional view of the LTPS TFT corresponding to step S210 of the manufacturing method of LTPS TFT in accordance with one embodiment.

As shown in FIG. 13, the gate 109 is formed on one side of the oxide layer 104 facing away the semiconductor layer 102 by sputtering.

The details of the steps S201~S209 may be referenced by referring to steps S101~S109 in FIG. 1, and thus are omitted hereinafter.

In the embodiment, the first photoresist layer 105 is formed. The first specific area 1021 of the semiconductor layer 102 is doped with the high-concentration doping ions to complete the SD doping. After the SD doping is completed, the first photoresist layer 105 is not completely stripped. In step S106, the ashing process is applied to the first photoresist layer 105 such that the first photoresist layer 105 becomes the second photoresist layer 107. Afterward, the low-concentration doping ions are doped within the second specific area 1022 of the semiconductor layer 102 via the second photoresist layer 107 to complete the LDD doping. During the manufacturing process, after the photoresist is coated once, two doping processes, including the SD doping and the LDD doping, are completed. Only one masking process is adopted during the doping process. Compared to the conventional technology, the number of the masking process id decreased and the manufacturing time is reduced.

Figure 14:
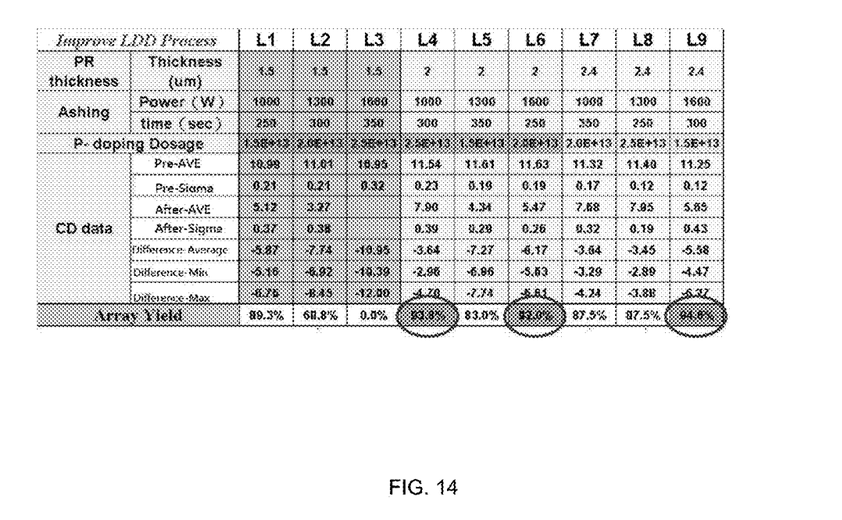
FIG. 14 is a parameter testing diagram of the LTPS TFT in accordance with one embodiment.

FIG. 14 is a parameter testing diagram of the LTPS TFT in accordance with one embodiment, wherein the parameters are obtained by the manufacturing methods of LTPS TFT in FIGS. 1 and 2.

FIG. 14 shows nine groups of parameters of the LTPS TFT manufacturing process, wherein PR thickness relates to the thickness of the second photoresist layer 107 and the unit is μm, the Ashing Power relates to the etching power of the ashing process and the unit is W, Ashing Time relates to the etching time period and the unit is second(s), P-doing Dosage relates to the P-type light doping concentration and the unit is $1/cm^{-3}$, and CD data relates to a Critical Dimension (CD), and Array Yield relates to an yield rate of the LTPS TFT. It can be understood that higher yield rate represents better manufacturing parameters.

In view of FIG. 14, when the P-type light doping concentration is $2.5 \times 10^{13}$ $cm^{-3}$, the ashing etching power is 1000 W, the etching time period is 300 s, the yield rate is 93.8% (Group 4, L4). When the P-type light doping concentration is $2.5 \times 10^{13}$ $cm^{-3}$, the ashing etching power is 1600 W, the etching time period is 300 s, the yield rate is 94.6% (Group 6, L6). When the P-type light doping concentration is $1.5 \times 10^{13}$ $cm^{-3}$, the ashing etching power is 1600 W, the etching time period is 300 s, the yield rate is 94.6% (Group 9, L9). In view of FIG. 14, it can be understood that the parameters in groups 4, 6, and 9 are better, and the yield rates of the manufacturing methods of FIGS. 1 and 2 are higher.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A manufacturing method of low temperature poly silicon (LTPS) thin film transistors (TFTs), comprising:

forming a semiconductor layer and a LTPS layer on one surface on a base layer;

forming an oxide layer is formed on one side of the semiconductor layer facing away the base layer, and forming the oxide layer on one side of the LTPS layer facing away the base layer;

a forming a plurality of first photoresist layers of a first thickness on the oxide layer;

arranging a corresponding first cobalt layer on each of the photoresist layers, a vertical projection of the first cobalt layer overlaps with a vertical projection of the corresponding first photoresist layer;

doping high concentration doping ions into a first area of the semiconductor layer, and the high-concentration being larger than $1 \times 10^{17}/cm^3$;

removing the first cobalt layer, and applying an ashing process to a portion of the first photoresist layers to obtain second photoresist layers of a second thickness, the second thickness is less than the first thickness;

arranging a corresponding second cobalt layer on the second photoresist layer, a vertical projection of the second cobalt layer is overlapped with the vertical projection of the corresponding second photoresist layer;

doping low concentration doping ions into a second area of the semiconductor layer, and the low-concentration being less than $1 \times 10^{14}/cm^3$; and removing the second cobalt layer, and applying the ashing process to the second photoresist layers to remove the second photoresist layers.

2. The method as claimed in claim 1, wherein the step of applying an ashing process to a portion of the first photoresist layers to obtain the second photoresist layers of a second thickness comprises:
   adopting an ion etching machine to etch a portion of the first photoresist layers to obtain the second photoresist layers of the second thickness, wherein an etching power of the ion etching machine is in a range between 1000 and 1600 W, and an etching time period is in a range between 250 and 350 s.

3. The method as claimed in claim 2, wherein the base layer comprises a substrate, a silicon nitride layer and a silicon oxide layer, wherein:
   the silicon nitride layer is arranged on the substrate, and the silicon oxide layer is arranged on one side of the silicon nitride layer facing away the substrate.

4. The method as claimed in claim 3, wherein the step of applying the ashing process to the second photoresist layers to remove the second photoresist layers further comprises:
   forming a gate on one side of the oxide layer facing away the semiconductor layer.

5. The method as claimed in claim 4, wherein the first thickness is in a range between 1 and 3 micrometers.

6. The method as claimed in claim 1, wherein the step of doping high-concentration doping ions into a first area of the semiconductor layer further comprises:
   adopting an ion implantation method to dope the high-concentration doping ions to the first area of the semiconductor layer; and
   wherein the high-concentration doping ions comprises high-concentration P-type doping ions or high-concentration N-type doping ions.

7. The method as claimed in claim 2, wherein the step of doping high-concentration doping ions into a first area of the semiconductor layer further comprises:
   adopting an ion implantation method to dope the high-concentration doping ions to the first area of the semiconductor layer; and
   wherein the high-concentration doping ions comprises high-concentration P-type doping ions or high-concentration N-type doping ions.

8. The method as claimed in claim 3, wherein the step of doping high-concentration doping ions into a first area of the semiconductor layer further comprises:
   adopting an ion implantation method to dope the high-concentration doping ions to the first area of the semiconductor layer; and
   wherein the high-concentration doping ions comprises high-concentration P-type doping ions or high-concentration N-type doping ions.

9. The method as claimed in claim 4, wherein the step of doping high-concentration doping ions into a first area of the semiconductor layer further comprises:
   adopting an ion implantation method to dope the high-concentration doping ions to the first area of the semiconductor layer; and
   wherein the high-concentration doping ions comprises high-concentration P-type doping ions or high-concentration N-type doping ions.

10. The method as claimed in claim 5, wherein the step of doping high-concentration doping ions into a first area of the semiconductor layer further comprises:
    adopting an ion implantation method to dope the high-concentration doping ions to the first area of the semiconductor layer; and
    wherein the high-concentration doping ions comprises high-concentration P-type doping ions or high-concentration N-type doping ions.

11. The method as claimed in claim 1, wherein the step of doping a low-concentration doping ions into a second area of the semiconductor layer further comprises:
    adopting an ion implantation method to dope the low-concentration doping ions to the second area of the semiconductor layer; and
    wherein the low-concentration doping ions comprises low-concentration P-type doping ions or low-concentration N-type doping ions.

12. The method as claimed in claim 2, wherein the step of doping a low-concentration doping ions into a second area of the semiconductor layer further comprises:
    adopting an ion implantation method to dope the low-concentration doping ions to the second area of the semiconductor layer; and
    wherein the low-concentration doping ions comprises low-concentration P-type doping ions or low-concentration N-type doping ions.

13. The method as claimed in claim 3, wherein the step of doping a low-concentration doping ions into a second area of the semiconductor layer further comprises:
    adopting an ion implantation method to dope the low-concentration doping ions to the second area of the semiconductor layer; and
    wherein the low-concentration doping ions comprises low-concentration P-type doping ions or low-concentration N-type doping ions.

14. The method as claimed in claim 4, wherein the step of doping a low-concentration doping ions into a second area of the semiconductor layer further comprises:
    adopting an ion implantation method to dope the low-concentration doping ions to the second area of the semiconductor layer; and
    wherein the low-concentration doping ions comprises low-concentration P-type doping ions or low-concentration N-type doping ions.

15. The method as claimed in claim 5, wherein the step of doping a low-concentration doping ions into a second area of the semiconductor layer further comprises:
    adopting an ion implantation method to dope the low-concentration doping ions to the second area of the semiconductor layer; and
    wherein the low-concentration doping ions comprises low-concentration P-type doping ions or low-concentration N-type doping ions.

* * * * *